United States Patent [19]

Van Vloten

[11] Patent Number: 4,869,068
[45] Date of Patent: Sep. 26, 1989

[54] HEAT TRANSFER STRAP

[75] Inventor: Curt Van Vloten, Chestnut Hill, Mass.

[73] Assignee: Spectra-Physics, Inc., San Jose, Calif.

[21] Appl. No.: 162,270

[22] Filed: Feb. 29, 1988

[51] Int. Cl.⁴ .............................................. F25B 19/00
[52] U.S. Cl. ...................................... 62/51.1; 62/55.5; 62/303; 165/185; 248/638; 361/386
[58] Field of Search ................... 62/383, 514 R, 55.5; 165/185; 361/386; 248/638

[56] References Cited

U.S. PATENT DOCUMENTS

| | | | |
|---|---|---|---|
| 4,142,893 | 3/1979 | Adlerstein et al. | 96/36.2 |
| 4,148,575 | 4/1979 | Siryj | 354/299 |
| 4,161,747 | 6/1979 | Jennings | 357/82 |
| 4,256,944 | 3/1981 | Brandon | 219/10.55 F |
| 4,286,142 | 9/1981 | Taylor | 219/390 |
| 4,394,819 | 6/1983 | Averill | 62/514 R |
| 4,588,028 | 5/1986 | Marshall et al. | 165/185 |
| 4,637,028 | 1/1987 | Kahan | 372/34 |
| 4,689,720 | 8/1987 | Daszkowski | 165/185 |
| 4,691,765 | 9/1987 | Wozniczka | 165/185 |

Primary Examiner—Ronald C. Capossela
Attorney, Agent, or Firm—Allegretti & Witcoff, Ltd.

[57] ABSTRACT

Apparatus to provide a flexible thermal link between a laser diode mounting structure and a cold finger of a helium refrigerator. The thermal link employs a heat transfer means which substantially reduces vibration experienced by a laser mount in the several directions of motion, reduces thermally caused stresses from large temperature variations, and provides good thermal conductivity between the helium refrigerator and the mounting structure.

19 Claims, 2 Drawing Sheets

HEAT TRANSFER STRAP

FIELD OF THE INVENTION

This invention relates in general to laser systems, and more particularly, to a laser diode mounting structure which provides good shock and vibration isolation along with good thermal conduction.

BACKGROUND OF THE INVENTION

A solid state laser, or laser diode, before it will emit electromagnetic radiation, must be cooled to cryogenic temperatures and excited by an outside source of energy. This source of energy emits radiation itself which the laser diode converts into a laser beam. Laser diodes generally are relatively inefficient, however, and thus convert into laser radiation only a small portion of the excitation energy, converting much of the remaining energy into heat. Because the efficiency of laser diode devices decreases with an increase in temperature, heat generated by the laser's inefficient use of its energy source exacerbates the inefficient operation of the laser. In order to counteract these heating and related operating problems, heat must be removed.

To remove heat and keep the laser cooled, laser systems tend to cool their laser diodes by connecting a closed-cycle helium refrigerator, by means of a cold finger, to the laser diode's mounting structure. The laser diode mount is placed adjacent to a cryogenically cold finger of a cryogenic refrigerator. The finger conducts the very low temperatures from the helium refrigerator to the laser device. A heater device is then connected to the laser mount to maintain it at a desired operating temperature corresponding to a desired radiation characteristic.

Cryogenic refrigerators create vibration during their operation, however, which if transmitted to the laser, detrimentally affects the performance of the lasing diode. These vibrations cause an instability in the diode output spectrum, and can cause modulation effects in the laser output. The cold finger may also cause large thermal gradients which can cause uneven laser diode cooling and can induce thermal stresses.

Various devices have been developed with the goal of achieving vibration isolation of a mechanical refrigerator from a cryogenically cooled laser diode. For example, thermal conductive straps as shown in U.S. Pat. No. 4,161,747, issued to Jennings, have been used. The basic limitation of the Jennings strap, however, is that it fails to impede all vibration transmission from the cold finger to the diode mount.

There is a definite need in the art for an improved vibration isolation mounting system. Accordingly, it is an object of the present invention to provide good vibration isolation between a mechanical cryogenic refrigerator and the laser diode mounting structure, while providing good thermal conductivity therebetween.

SUMMARY OF THE INVENTION

The present invention provides an improvement in conductively cooling a laser diode. In particular, an improved thermally conductive and flexible conductive strap is disclosed which connects the laser diode mounting structure to a cold finger of a helium refrigerator, providing improved vibration isolation in all three degrees of motion.

In the preferred embodiment, the conductive strap is comprised of a material of low thermal impedance, such as oxygen-free copper, folded to form two orthogonally directed collars, or loops, in such a way as to provide high vibration decoupling with good thermal coupling.

The present invention provides a technique to cool the laser diode which is so thermally conductive and flexible that it eliminates a significant portion of the mechanical stresses of expansion or contraction of the refrigerator cold finger and laser mount. The present invention thus enables the laser diode to generate a beam with minimal optical distortion and excellent collimation characteristics.

DESCRIPTION OF THE DRAWINGS

The invention will be more fully understood from the following detailed description, taken in conjunction with the accompanying drawings, in which.

DESCRIPTION OF THE PREFERRED EMBODIMENT

With reference now to the drawings, there is shown a preferred embodiment of an apparatus for a flexible vibrationally isolated thermal link between a laser diode mounting structure and the cold finger of a helium refrigerator.

Figure 1:
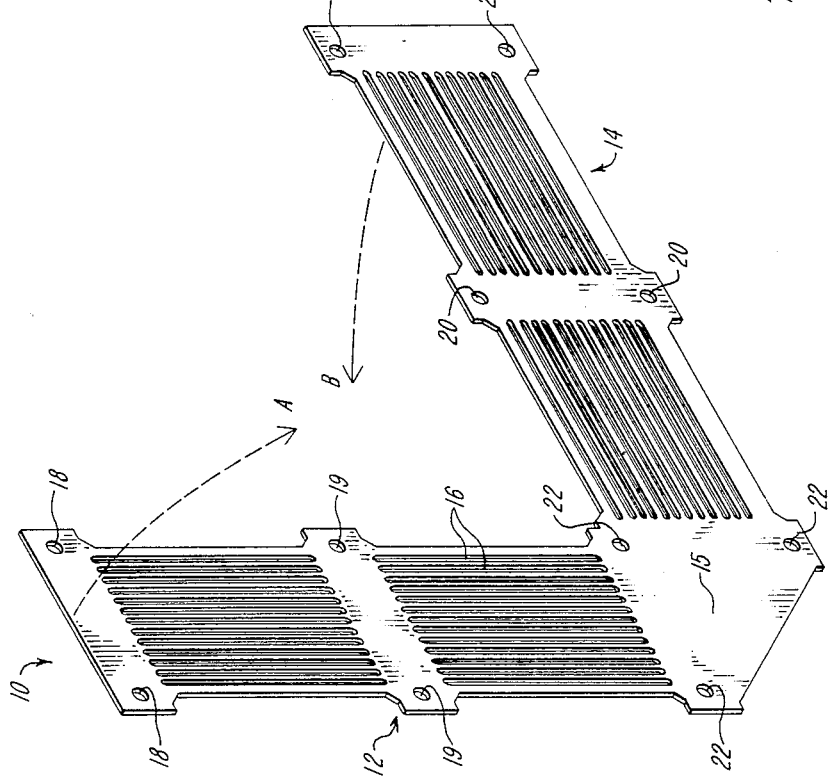
FIG. 1 is a perspective view of the heat transfer strap prior to assembly into its operative embodiment.

With reference to FIG. 1, a heat transfer strap 10 is shown in its unfolded state. The heat transfer strap 10 is comprised of two legs 12 and 14 extending at 90° angles to each other and joined at a triangular elbow 15. Legs 12 and 14 are selectively etched through to form parallel slits 16 that provide added flexibility and thus better vibration isolation. The heat transfer strap 10 is preferably made of an oxygen-free copper, approximately 10 mils thick, and which may be gold-plated for environmental protection. Copper is used because of its good thermal conductivity and low cost.

Hole pairs 18, 19, 20 and 21 are placed into strap 10 at predetermined locations of the legs to provide suitable mounting holes, and to allow the heat strap to be fastened in its desired shape. Strap 10 also has three holes 22 located in elbow 15. The heat strap 10 is wider around each of holes 18–22 than at its intermediate sections so as to provide additional mechanical strength when screws or bolts are placed through the holes. The distance between adjacent pairs of holes 18–22 on each of the legs 12 and 14 is substantially equal.

Figure 2:
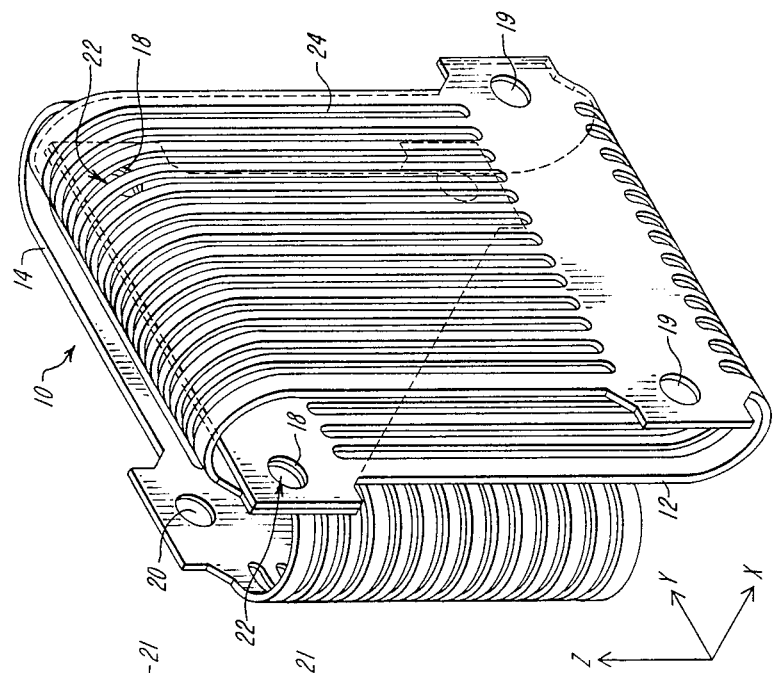
FIG. 2 is a perspective view of the heat transfer strap of FIG. 1 assembled into its operative embodiment.

FIG. 2 depicts the heat transfer strap 10 after it has been assembled into its operative mode. In the embodiment shown, leg 12 has been folded completely around in the direction indicated in FIG. 1 by the dashed arrow A. Leg 12 is folded such that the pair of holes 18 align with the pair of holes 22 that are nearest to holes 18. The folding orients holes 19 so as to place them appropriately for mounting to a laser diode mounting structure or cold finger.

Similarly, leg 14 is folded over itself in the direction indicated in FIG. 2 by the dashed arrow B. After leg 14 is folded, holes 21 overlap the pair of holes 22 on elbow 15 nearest holes 21. (These holes are not shown in FIG. 2). After folding, holes 20 (one shown) are in a position for mounting to the other of a laser diode mounting structure or cold finger. The heat transfer strap 10 is folded such that mounting holes 19 and 20 on legs 12 and 14 lie in parallel planes to facilitate mounting of the heat transfer strap 10 between the cold finger and the laser diode mounting structure. The overlapping holes 18 and 22, and 21 and 22 are fastened together. The fastening may be by welding or soldering along the line between the hole pairs, using the holes for alignment.

Figure 3:
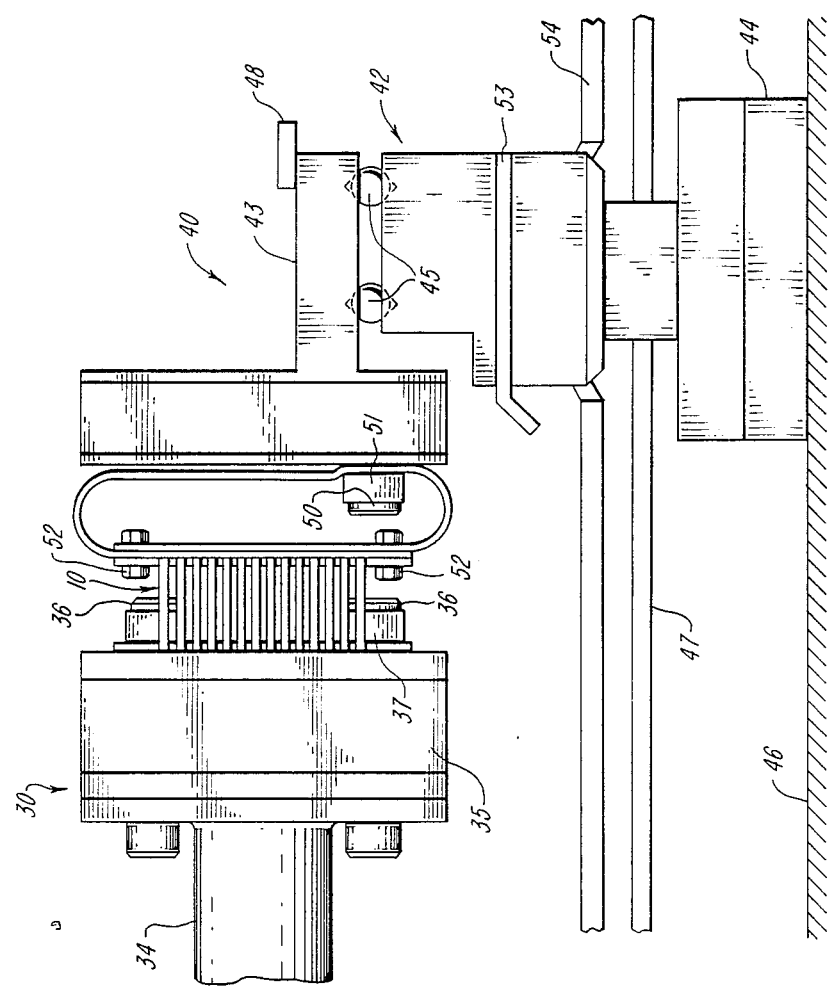
FIG. 3 is a side view of the heat transfer strap of the present invention located between a refrigerator cold finger and a laser mounting structure.

FIG. 3 shows the heat transfer strap 10 mounted in its operative position between a cold finger assembly 30 and a laser diode mounting structure 40. It will be appreciated that in its assembled embodiment, the heat transfer strap 10 has substantial flexibility in each of the orthogonal X, Y and Z directions.

The cold finger assembly 30 from the cryogenic refrigerator (not shown) protrudes into a vacuum housing containing the laser diode mounting structure 40. The cold finger assembly 30 includes a cold finger 34 which is generally constructed of oxygen-free high conductivity copper and which is connected in a mechanically rigid, thermally conductive fashion to the refrigerator. The cold finger's normal minimum operating temperature is about 8° to 10° K. Because the cold finger 34 is directly connected to the second stage of the refrigerator, it is subject to the shock impulses and other vibrations inherent in such refrigerators. The refrigerator or cooler unit employed in the preferred embodiment of the present invention is the Gifford McMahon cycle type, available from Cryogenic Technology, Inc., such as their Model No. 21. Other cooler types that provide cryogenic cooling are also applicable for use with the present invention including the Sterling cycle, Vuilleumier cycle and Brayton cycle, each of which produce vibrations deleterious to the operation of the laser diode.

The cold finger 34 terminates in a copper indium sandwich flange 35 which acts as a thermal fluctuation damper and which is connected to the thermal strap 10 by means of two bolts 36 and clamp bar 37. The clamp bar 37 is stainless steel, approximately 1.5"×0.25"×0.125, and clamps the strap 10 along its width to the flange 35 so as to assure continuous thermal contact between the flange 35 and strap 10. The heat transfer strap 10 is thus thermally connected to the cold finger 34.

The heat transfer strap 10 is connected at its opposite end by means of two similar bolts 50 (only one shown) and clamp bar 51 to a laser diode mount 43 which is part of the laser mounting structure 40. The laser mounting structure 40 comprises an insulating stand-off assembly 42 which rigidly attaches the laser diode mount 43 to the housing support 44, which is in turn connected through a vacuum housing 47 to a mounting base 46. Laser diode mount 43 is attached to support 44 by nylon balls 45 set in holes in the mount 43 and assembly 42 which are in turn clamped together in a fashion that thermally isolates the laser diode mount 43 from the support 44. Because support 44 is at room temperature, without thermal isolation there will be a large thermal load on the cold finger 34 and diode mount 43. The requirement for a mechanically rigid structure without a substantial thermal load is met by establishing two cold stations within the stand-off assembly 42. Shell 54 and plate 53 are attached to the refrigerator 77° K. stage above the cold finger and thus impede heating of mount 43 through assembly 42, and from radiation from the room temperature vacuum housing 47.

A laser diode 48 is attached to the diode mount 43, and is in direct thermal contact to it. The laser diode may be of any type known in the art.

Heat strap 10 is shown in FIG. 3 assembled as shown in FIG. 2. Bolts 52 are placed through the paired holes 18, 22 and 21, 22, respectively, as shown in FIG. 2, and are used to hold strap 10 into its assembled structure for assembly purposes. The strap is then soldered together with indium solder.

As can be seen, this invention permits the laser diode 48 to be shock isolated while concurrently cooled at a constant temperature, thus preventing temperature or vibration induced changes in its output frequency. The fundamental requirement of the mounting structure is to allow the transmission of the cold finger temperature to the laser diode without transmitting the vibration from the cold finger. The mounting structure also functions to smooth out the temperature variations of the cold tip which tend to casue diode frequency instability, and to thermally isolate the diode from the remaining elements.

As is apparent from the present description, although the described embodiment is of a single copper metal sheet folded to connect a laser diode mount and helium refrigerator, other modifications and alternative implementations will occur to those versed in the art without departing from the true spirit and scope of the invention. Accordingly, it is not intended to limit the invention to what has been particularly shown and described except as indicated in the appended claims.

What is claimed:

1. Apparatus for providing heat transfer between a source and a sink without coupling vibration comprising:
   first and second collars formed of a flexible thermally conductive sheet material, each characterized by an axis through the respective open ends thereof,
   said first and second collars being in thermal contact with each other at respective portions thereof in which condition the axis of said collars are angled at approximately right angles; and
   said first and second collars adapted to be placed in thermal contact with said sink and source respectively at points substantially opposite said collar portions.

2. The apparatus of claim 1, wherein said first and second collars have slits extending through said sheet material circumferentially about each respective axis.

3. The apparatus of claim 1, wherein said first and second collars each comprise a single integral metal sheet.

4. The apparatus of claim 1, wherein said first and second collars are formed from a rolled single integral metal sheet wherein such sheet comprises at least two respective legs extending at substantially perpendicular angles to each other to produce an "L"-shaped sheet.

5. The apparatus of claim 4, wherein said metal sheet comprises copper.

6. The apparatus of claim 4, wherein said first and second collars are in thermal contact at an apex of said "L"-shaped sheet.

7. The apparatus of claim 1, further including first and second mounting means, integral to said first and second collars, for mounting said first and second collars to said source and sink respectively.

8. The apparatus of claim 1, wherein said source includes a radiation source or detector and said sink includes a refrigerator.

9. Apparatus for providing heat transfer between a source and sink without coupling vibration comprising:
a first loop of a thermally conductive material, with a first circumference;
a second loop of a thermally conductive material, with a second circumference;
means for thermally connecting at substantially orthogonal angles said first loop to said second loop;
said first loop being adapted to be placed in thermal contact with said sink or source; and
said second loop being adapted to be placed in thermal contact with the other of said sink or source.

10. The apparatus of claim 9, wherein said first and second loops comprise a single metal sheet.

11. The apparatus of claim 10, wherein said single metal sheet comprises two legs extending at substantially perpendicular angles to each other.

12. The apparatus of claim 11, wherein said first and second loops include means integral to said single metal sheet for placing each loop in thermal contact with respective ones of said sink and source.

13. A method for providing a thermal coupling between a cold finger of a cryogenic refrigerator and a controlled temperature pedestal for a radiation source or sensor, comprising the steps of:
providing a sheet of metal with a first leg and a second leg extending substantially perpendicularly to each other and joined at an elbow;
folding said first and second legs to provide first and second loops substantially orthogonal to each other; and
thermally connecting said first and second loop to said controlled temperature pedestal and said refrigerator respectively.

14. The method of claim 13, further comprising the steps of:
perforating said first leg with perforations parallel to a length thereof; and
perforating said second leg with perforations parallel to a length thereof.

15. The method of claim 13, further including the steps of:
providing on said sheet of metal an integral means for connecting a surface of said first loop to said cold finger or pedestal; and
providing on said sheet of metal an integral means for connecting a surface of said second loop to the other of said cold finger or pedestal.

16. A method for thermally coupling a mount for a radiation source or sink to a refrigerator cold finger comprising the steps:
placing first and second loops at orthogonal angles to each other;
thermally connecting said first and second loops at respective loop portions;
connecting a surface of said first loop at a location substantially opposite said respective portion to a surface of either said cold finger or said mount; and
connecting a surface of said second loop at a location substantially opposite said respective portion to a surface of the other of said mount or cold finger.

17. The method of claim 16, wherein said step of connecting said first and second loops includes the step of joining said loops at an elbow between a first leg and a second leg of a single sheet of metal, each leg placed substantially perpendicular to each other.

18. A method for providing thermal conductivity, without transmission of vibration, between a source and a sink comprising the steps of:
conducting heat around a first loop between one of said source and sink to a predetermined thermal transfer location of said first loop;
conducting heat around a second loop, set substantially orthogonal to said first loop, between the other of said source and sink to a loop thermal transfer location of said second loop; and
conducting heat between said first and second loop thermal transfer locations.

19. The method of claim 18, wherein said step of conducting heat around said first and second loops includes the step of conducting heat along bands of said loops defining slits in said loops.

* * * * *